(12) United States Patent
Tominaga et al.

(10) Patent No.: US 9,153,315 B2
(45) Date of Patent: Oct. 6, 2015

(54) SOLID MEMORY

(71) Applicant: NATIONAL INSTITUTE OF ADVANCED INDUSTRIAL SCIENCE AND TECHNOLOGY, Tokyo (JP)

(72) Inventors: Junji Tominaga, Tsukuba (JP); James Paul Fons, Tsukuba (JP); Alexander Kolobov, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 13/923,454

(22) Filed: Jun. 21, 2013

(65) Prior Publication Data

US 2013/0279247 A1 Oct. 24, 2013

Related U.S. Application Data

(63) Continuation of application No. 12/733,296, filed as application No. PCT/JP2008/060858 on Jun. 13, 2008, now abandoned.

(30) Foreign Application Priority Data

Aug. 31, 2007 (JP) ................................. 2007-226022

(51) Int. Cl.
*H01L 45/00* (2006.01)
*G11C 13/00* (2006.01)
(Continued)

(52) U.S. Cl.
CPC ............. *G11C 13/0009* (2013.01); *B82Y 10/00* (2013.01); *G11B 7/2433* (2013.01);
(Continued)

(58) Field of Classification Search
CPC ...... H01L 45/06; H01L 45/065; H01L 45/141; H01L 45/144; G11C 13/0002; G11C 13/0004
USPC ................ 257/2, E45.002; 365/148, 163
See application file for complete search history.

(56) References Cited

U.S. PATENT DOCUMENTS 5,187,052 A 2/1993 Maeda et al.
5,341,328 A * 8/1994 Ovshinsky et al. ........... 365/163
(Continued)

FOREIGN PATENT DOCUMENTS

JP 08-085261 4/1996 ............... B41M 5/26
JP H08106447 A 4/1996
(Continued)

OTHER PUBLICATIONS

Kolobov, A., et al. (2004), "Understanding the phase-change mechanism of rewritable optical media", *Nature Materials*, 3: 703-708.
(Continued)

*Primary Examiner* — Allison P Bernstein
(74) *Attorney, Agent, or Firm* — Harness, Dickey & Pierce, P.L.C.

(57) ABSTRACT

Recording and erasing of data in PRAM have hitherto been performed based on a change in physical characteristics caused by primary phase-transformation of a crystalline state and an amorphous state of a chalcogen compound including Te which serves as a recording material. Since, however, a recording thin film is formed of a polycrystal but not a single crystal, a variation in resistance values occurs and a change in volume caused upon phase-transition has placed a limit on the number of times of readout of record. In one embodiment, the above problem is solved by preparing a solid memory having a superlattice structure of thin films including Ge and thin films including Sb. The solid memory can realize the number of times of repeated recording and erasing of $10^{15}$.

14 Claims, 3 Drawing Sheets

White circle represents Te.
black circle represents Sb.
black triangle represents Ge.

(51) Int. Cl.
- *B82Y 10/00* (2011.01)
- *G11B 7/2433* (2013.01)
- *G11B 7/243* (2013.01)
- *H01L 29/15* (2006.01)
- *H01L 29/18* (2006.01)

(52) U.S. Cl.
CPC ............ *H01L 45/06* (2013.01); *H01L 45/144* (2013.01); *H01L 45/1625* (2013.01); *G11B 2007/24312* (2013.01); *G11B 2007/24314* (2013.01); *G11B 2007/24316* (2013.01); *H01L 29/15* (2013.01); *H01L 29/18* (2013.01)

(56) References Cited

U.S. PATENT DOCUMENTS

| | | | |
|---|---|---|---|
| 5,514,440 A | 5/1996 | Gotoh et al. | |
| 5,596,522 A | 1/1997 | Ovshinsky et al. | |
| 5,825,046 A | 10/1998 | Czubatyl et al. | 257/2 |
| 6,087,674 A | 7/2000 | Ovshinsky et al. | 257/2 |
| 7,692,176 B2 | 4/2010 | Ha et al. | 257/4 |
| 8,396,335 B2 | 3/2013 | Tominaga et al. | 385/2 |
| 2002/0131309 A1 | 9/2002 | Nishihara et al. | 365/200 |
| 2004/0165422 A1 | 8/2004 | Hideki et al. | 365/163 |
| 2004/0178401 A1 | 9/2004 | Ovshinsky et al. | 257/2 |
| 2004/0178402 A1 | 9/2004 | Ovshinsky et al. | 257/2 |
| 2004/0178403 A1 | 9/2004 | Ovshinsky | 257/4 |
| 2004/0178404 A1 | 9/2004 | Ovshinsky | 257/4 |
| 2004/0179394 A1 | 9/2004 | Ovshinsky et al. | 365/163 |
| 2005/0002227 A1 | 1/2005 | Hideki et al. | 365/163 |
| 2006/0011942 A1 | 1/2006 | Kim et al. | 257/192 |
| 2006/0039192 A1 | 2/2006 | Ha et al. | 365/163 |
| 2006/0118774 A1 | 6/2006 | Ovshinsky | 257/8 |
| 2006/0172067 A1 | 8/2006 | Ovshinsky et al. | 427/248.1 |
| 2006/0172068 A1 | 8/2006 | Ovshinsky et al. | 427/248.1 |
| 2006/0209495 A1 | 9/2006 | Lee et al. | 361/502 |
| 2006/0234462 A1 | 10/2006 | Ovshinsky et al. | 438/382 |
| 2006/0281217 A1 | 12/2006 | Hideki et al. | 438/102 |
| 2007/0054475 A1* | 3/2007 | Lee et al. | 438/483 |
| 2007/0160760 A1 | 7/2007 | Shin et al. | 427/255.35 |
| 2007/0181867 A1 | 8/2007 | Hewak et al. | 257/4 |
| 2007/0215853 A1 | 9/2007 | Park et al. | 257/4 |
| 2007/0221906 A1 | 9/2007 | Hideki et al. | 257/2 |
| 2008/0035907 A1 | 2/2008 | Czubatyl et al. | 257/4 |
| 2008/0169457 A1 | 7/2008 | Hideki et al. | 257/2 |
| 2008/0210924 A1 | 9/2008 | Shin | 257/4 |
| 2009/0004773 A1 | 1/2009 | Park et al. | 438/102 |
| 2009/0280052 A1 | 11/2009 | Xiao et al. | 423/508 |
| 2010/0019216 A1 | 1/2010 | Park et al. | 257/2 |
| 2010/0144087 A1 | 6/2010 | Ha et al. | 438/102 |
| 2010/0181548 A1 | 7/2010 | Tominaga et al. | 257/2 |
| 2010/0193824 A1 | 8/2010 | Kim et al. | 257/98 |
| 2010/0200828 A1 | 8/2010 | Tominaga et al. | 257/2 |
| 2010/0207090 A1 | 8/2010 | Tominaga et al. | 257/2 |

FOREIGN PATENT DOCUMENTS

| | | | |
|---|---|---|---|
| JP | 2001-502848 | 2/2001 | H01L 27/10 |
| JP | 2001-096919 | 4/2001 | B41M 5/26 |
| JP | 2002-203392 | 7/2002 | G11C 13/02 |
| JP | 2002-246561 | 8/2002 | H01L 27/10 |
| JP | 2005-170059 | 6/2005 | B41M 5/26 |
| JP | 2008-182227 | 8/2008 | H01L 27/105 |
| KR | 10-2004-0076225 | 8/2004 | H01L 27/115 |
| KR | 10-2006-0006195 | 1/2006 | H01L 27/115 |
| KR | 10-2006-0016418 | 2/2006 | H01L 27/115 |
| KR | 10-2006-0121895 | 11/2006 | H01L 27/115 |
| WO | WO 2006/083481 | 8/2006 | C23C 16/00 |
| WO | WO 2006/057616 | 5/2008 | C07F 7/30 |
| WO | WO-2008057616 A2 | 5/2008 | |

OTHER PUBLICATIONS

Supervised by Okuda, M. (2004), "Technology and materials for future optical memories", 114-115, Partial English Translation.

Supervised by Tsunoda, Y. (2001), "Basis and application of optical disc storage (hikari disc storage no kiso to oyo)", 209, Partial English Translation.

Yamada, N., et al. (2000), "Structure of laser-crystallized $Ge_2 Sb_{2+x} Te_5$ sputtered thin films for use in optical memory", *Journal of Applied Physics*, 88(12): 7020-7028.

Office Action dated Oct. 7, 2011 issued in U.S. Appl. No. 12/733,295.

Office Action dated Oct. 7, 2011 issued in U.S. Appl. No. 12/733,296.

Office Action dated Apr. 12, 2012 issued in U.S. Appl. No. 12/690,711.

Office Action dated May 24, 2012 issued in U.S. Appl. No. 12/733,295.

Office Action dated May 25, 2012 issued in U.S. Appl. No. 12/733,296.

Office Action dated Jul. 25, 2012 issued in U.S. Appl. No. 12/690,711.

Office Action dated Dec. 19, 2012 issued in U.S. Appl. No. 12/733,295.

Office Action dated Dec. 19, 2012 issued in U.S. Appl. No. 12/733,296.

Office Action dated Feb. 27, 2013 issued in U.S. Appl. No. 12/733,296.

Office Action dated Feb. 28, 2013 issued in U.S. Appl. No. 12/733,295.

International Search Report dated Sep. 9, 2008 issued in PCT Application No. PCT/JP2008/060858.

Notice of Allowance dated Aug. 26, 2011 issued in Korean Application No. 10-2010-7006526, No Translation Available.

U.S. Office Action issued in U.S. Appl. No. 13/923,447, dated Oct. 6, 2014.

U.S. Office Action for corresponding U.S. Appl. No. 13/923,447 mailed Mar. 5, 2015.

* cited by examiner

White circle represents Te,
black circle represents Sb,
black triangle represents Ge.

White circle represents Te,
black circle represents Sb,
black triangle represents Ge.

F I G. 3
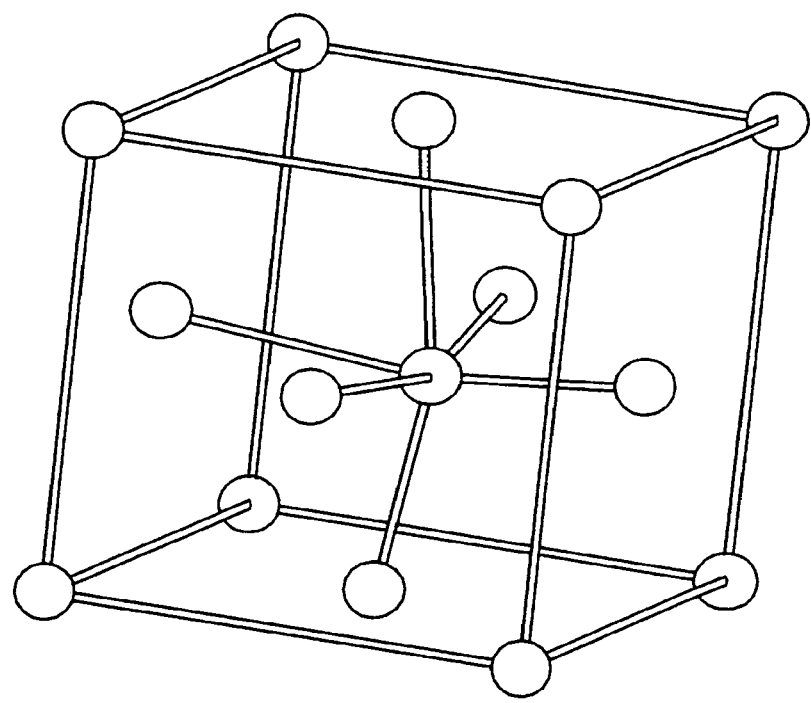

White circle represents Te,
black circle represents Sb,
black triangle represents Ge.

SOLID MEMORY

CROSS-REFERENCE TO RELATED APPLICATIONS

The present application is a continuation of pending U.S. application Ser. No. 12/733,296, filed 23 Feb. 2010 which is a national stage of PCT/JP2008/060858, filed 13 Jun. 2008 which claims priority to JP 2007-226022, filed 31 Aug. 2007. The above referenced applications are incorporated herein by reference in its entirety.

TECHNICAL FIELD

The present invention relates to a solid memory (phase-change RAM or PRAM) for recording and erasing, as data, a difference in electric resistance or optical characteristics which is caused between a crystalline state and an amorphous state of phase-transformation of a chalcogen compound consisting mainly of Te.

BACKGROUND ART

Recording and erasing of data in phase-change RAM have hitherto been performed based on a change in physical characteristics caused by primary phase-transformation between a crystalline state and an amorphous state of a chalcogen compound including Te which serves as a recording material, and phase-change RAM has been designed based on this basic principle (for example, see Patent Literature 1 below).

A Recording material used for recording and erasing data in a phase-change RAM is generally formed between electrodes by using a vacuum film formation method such as sputtering. Usually, a single-layered alloy thin film made by using a target made of a compound is used as such recording material.

Therefore, a recording thin film of 20-50 nm in thickness consists of a polycrystal but not a single crystal.

A difference in interfacial electric resistance between individual microcrystals influences uniformity in electric resistance values throughout a phase-change RAM as a whole, and causes variations in resistance values in a crystalline state (see Non Patent Literature 1 below).

Furthermore, it has been considered that about 10% change in volume generated in phase-transition between a crystalline state and an amorphous state causes individual microcrystals to have different stresses, and flow of material and deformation of an entire film restrict the number of times of readout of record (see Non Patent Literature 2 below).

Patent Literature 1: Japanese Patent Application Publication, Tokukai, No. 2002-203392 A Non Patent Literature 1: supervisor: Masahiro Okuda, Zisedai Hikari Kiroku Gizyutsu to Zairyo (Technology and Materials for Future Optical Memories), CMC Publishing Company, issued on Jan. 31, 2004, p 114

Non Patent Literature 2: supervisor: Yoshito Kadota, Hikari Disc Storage no Kiso to Oyo, edited by The Institute of Electronics, Information and Communication Engineer (IEICE), third impression of the first edition issued on Jun. 1, 2001, p 209

Non Patent Literature 3: Y. Yamanda & T. Matsunaga, Journal of Applied Physics, 88, (2000) p 7020-7028

Non Patent Literature 4: A. Kolobov et al. Nature Materials 3 (2004) p 703

SUMMARY OF INVENTION

Technical Problem

Regarding a crystalline structure and an amorphous structure of a chalcogen compound including Te, the structural analysis has been made by X-ray and so on since the latter 1980s. However, since the atomic number of Te is next to that of Sb atoms which form the compound with Te and the number of electrons of Te is different from that of Sb atoms only by one, X-ray diffraction and electron ray diffraction have hardly succeeded in discriminating Te from Sb. Consequently, detail of the crystalline structure of the chalcogen compound had been unclear until 2004.

Particularly, experiments have demonstrated that characteristics of a compound called GeSbTe (225 composition) and compositions prepared based on a pseudobinary compound (a compound prepared based on GeTe—$Sb_2Te_3$, i.e. 225, 147 and 125 compositions), which have been already commercialized in the field of rewritable optical discs, are very excellent. However, it has been considered that crystalline structures of the compound and the compositions are sodium chloride structures with Te occupying a site (site (a)) which Na occupies and with Ge or Sb occupying a site (site (b)) which Cl occupies, and the way of occupying is random (see Non Patent Literature 3 above).

When structural analysis of a GeSbTe compound was made minutely by a synchrotron radiation orbit unit and so on, it was found that a chalcogen compound including Te took on a different aspect from a conventional structure in the following points (see Non Patent Literature 4 above).

1. In a crystalline phase, orderings of Ge atoms and Sb atoms which occupy positions of Cl (site (b)) within NaCl-simple cubic lattices are not in a "random" state as having been considered so far, but positions of orderings of atoms are properly "determined". Furthermore, lattices are twisted (see FIG. 1).

2. In an amorphous state, orderings of atoms are not entirely random, but Ge atoms within crystalline lattices are positioned closer to Te atoms by 2A from the center (though a bit misaligned and ferroelectric), and the amorphous state has a twisted structure while maintaining its atom unit (see FIG. 2).

3. Restoration of the twisted unit enables high-speed switching to be repeated stably (see FIG. 3).

From the new principle of rewriting and readout, it was found that formation of a chalcogen compound including Te by the following method allows providing a new phase-change RAM capable of reducing interfacial electric resistance between individual microcrystals as much as possible, and of drastically increasing the number of times of repeated rewriting.

That is, it was found that a new phase-change RAM which can improve characteristics of a conventional phase-change RAM drastically is produced by forming GeSbTe compounds as superlattices including thin films of GeTe and thin films of $Sb_2Te_3$, causing Ge atoms within GeTe layers to be diffused over interfaces between the GeTe layers and $Sb_2Te_3$ layers by electric energy inputted in a memory so as to form "anisotropic crystal" which is a structure similar to a crystalline state (an erasing (recording) state) and returning Ge atoms stored in the interfaces to the original positions within GeTe layers by electric energy so as to return the structure to "an amorphous-like structure" which has an electric resistance value similar to that of a random structure referred to as an amorphous conventionally (a recording (erasing) state).

FIG. 4 shows a basic structure of this arrangement. The thickness of GeTe layers is about 0.4 nm, and the thickness of $Sb_2Te_3$ layers is about 0.5 nm. Generally, the thickness of each layer is preferably about 0.3-2 nm.

For example, in a case of forming a structure of the present invention by sputtering, it is preferable that a speed of film formation per time with respect to an electric power required for sputtering be measured in advance by using a compound target including GeTe or $Sb_2Te_3$ (or by using a single target). By doing this, only controlling a time for the film formation allows easily forming a superlattice structure including these films.

In a case of forming a single-layered recording film with use of a compound target including composition of GeSbTe, movement of Ge atoms within a resulting microcrystal is random with respect to each microcrystal, and electric energy given in order to move Ge atoms does not have coherency, hence a lot of heat energy has to be wasted as entropy to a system thermodynamically, whereas in a superlattice structure of the present invention, movement of Ge atoms is made in a single direction (that is, having coherency) in a recording film as shown in FIG. 4, plentiful input energy is available for energy as a work, and amount of energy wasted as heat (entropy) can be reduced. Therefore, energy efficiency for performing phase-transformation is improved.

Furthermore, a change in volume (change in volume between a crystalline state and an amorphous state) caused by rewriting can be reduced by using an amorphous-like structure, and limiting a change in volume only to a uniaxial direction (that is, a work) allows operation of stably repeated rewriting without composition segregation.

Advantageous Effects of Invention

With the present invention, formation of a chalcogen compound including Te enables providing a new phase-change RAM which can reduce interfacial electric resistance between individual microcrystals as much as possible, make current value in recording data of a conventional phase-change RAM one-tenth or less, and increase the number of times of repeated rewriting in 2-3 digits or more.

BRIEF DESCRIPTION OF DRAWINGS

FIG. 3 shows a basic cell for switching of a phase-change RAM.

DESCRIPTION OF EMBODIMENTS

Figure 1:
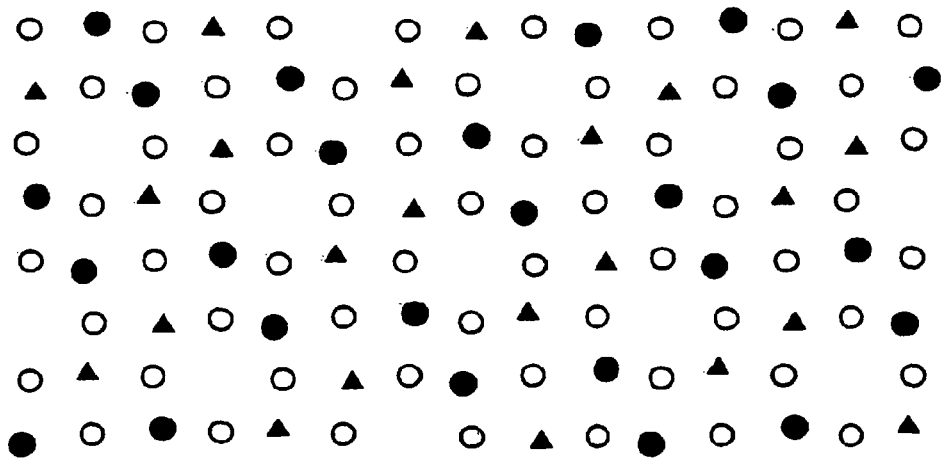
FIG. 1 shows a crystalline structure of Ge—Sb—Te alloy. Quadrangle represents Te, triangle represents Sb and circle represents Ge.
Figure 2:
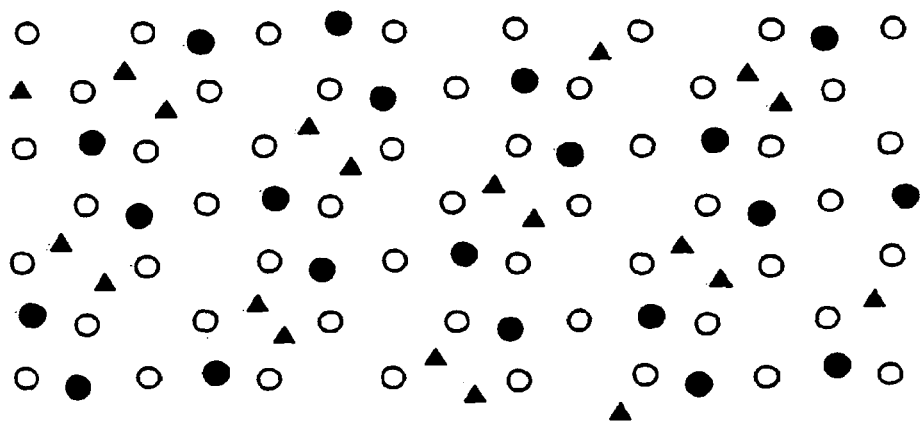
FIG. 2 shows an amorphous structure (short-distance structure) of Ge—Sb—Te alloy.
Figure 4:
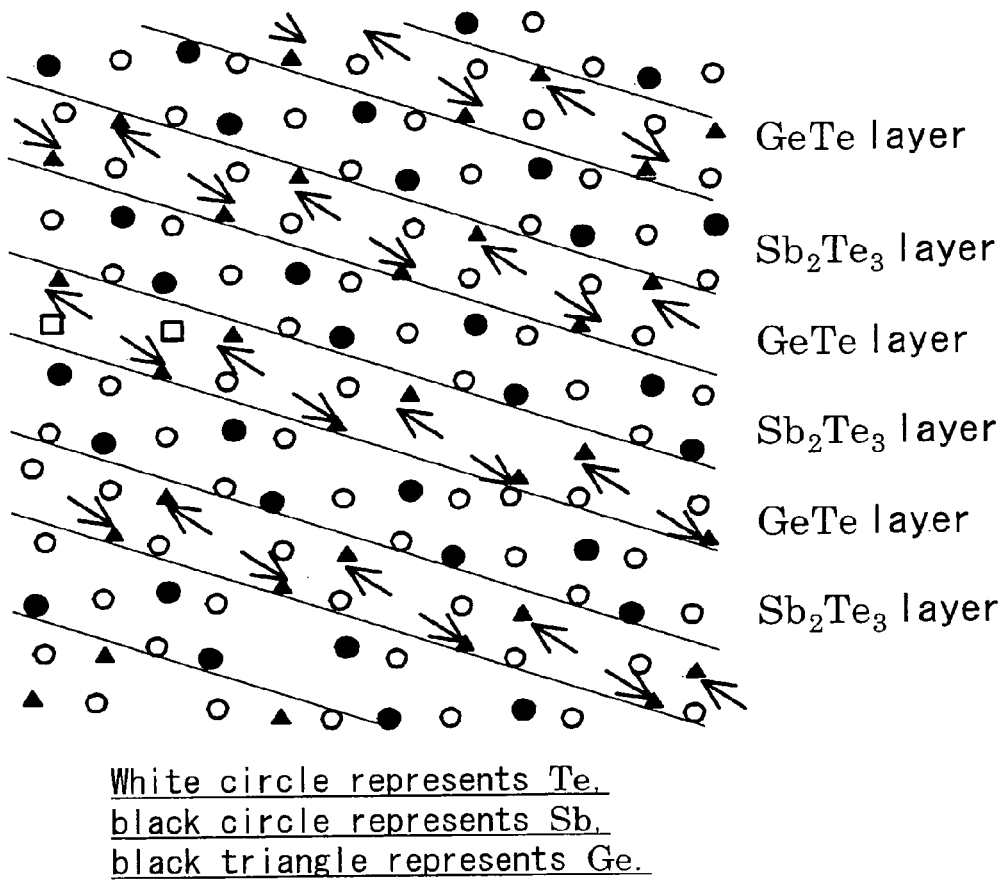
FIG. 4 shows a superlattice structure including GeTe and $Sb_2Te_3$.

Best mode for carrying out the present invention is described below.

Example 1

A phase-separation RAM was formed using a basic technique of general self-resistance heating. TiN was used for an electrode. 20-layers of superlattices of GeTe and $Sb_2Te_3$ were laminated and the laminate was used as a recording film. The thickness of an entire recording film including the superlattices was 10 nm. The size of a cell was 100×100 $nm^2$ square.

A voltage was applied on this device programmatically and current values in recording and erasing were measured. The results of measurements show that in recording, the current value was 0.2 mA and the time of pulse was 5 ns, and in erasing, the current value was 0.05 mA and the time of pulse was 60 ns. The number of times of repeated recording and erasing at these current values was measured to be $10^{15}$.

Reference Example

A phase-change RAM was formed using a technique of general self-resistance heating as in Example 1. A 20 nm single-layered film of $Ge_2Sb_2Te_5$ was formed for a recording film. The size of a cell was 100×100 $nm^2$ square. A voltage was applied on this device programmatically and current values in recording and erasing were measured. As a result, the current value in recording was 1.0 mA and the current value in erasing was 0.4 mA. Note that irradiation time of pulse was the same as in Example 1. The number of times of repeated recording and erasing at these current values was measured to be $10^{12}$.

INDUSTRIAL APPLICABILITY

In the present invention, formation of a chalcogen compound including Te enables providing a new phase-change RAM which can reduce interfacial electric resistance between individual microcrystals as much as possible, and can increase the number of times of repeated rewriting drastically.

The invention claimed is:

1. A method for recording data in a solid memory mainly made of tellurium (Te), comprising:
   recording data in the solid memory by causing phase-transformation of a substance constituting the solid memory so as to change electric characteristics of the solid memory, the substance including a laminated structure of artificial superlattices, the laminated structure including alternating first and second thin film layers of binary alloys,
   the phase-transformation being caused by germanium (Ge) atoms reversibly and anisotropically diffusing from the first thin film layer to interfaces between the first thin film layer and the second thin film layer.

2. The method as set forth in claim 1, wherein:
   the laminated structure is made of the first thin film layer including germanium (Ge) atoms and the second thin film layer including stibium (Sb) atoms.

3. The method as set forth in claim 2, wherein:
   a thickness of each of the first and second thin film layers ranging from 0.3 to 2 nm.

4. The method as set forth in claim 3, wherein:
   the germanium (Ge) atoms are reversibly and anisotropically diffused from the first thin film layer to interfaces between the first thin film and the second thin film layer by electric energy.

5. The method as set forth in claim 3, wherein:
   the phase-transformation is further caused by causing germanium (Ge) atoms stored in interfaces between the first thin film layer and the second thin film layer to be reversibly and anisotropically diffused to the first thin film layer.

6. The method as set forth in claim 5, wherein:
   the germanium (Ge) atoms stored in the interfaces between the first thin film layer and the second thin film layer are reversibly and anisotropically diffused to the first thin film layer by electric energy.

7. The method of claim 1, wherein the first thin film layer is GeTe and the second thin film layer is $Sb_2Te_3$.

8. A method for erasing data from a solid memory mainly made of tellurium (Te), comprising:

erasing data from the solid memory by causing phase-transformation of a substance constituting the solid memory so as to change electric characteristics of the solid memory, the substance including a laminated structure of artificial superlattices, the laminated structure including alternating first and second thin film layers of binary alloys, the phase-transformation being caused by germanium (Ge) atoms reversibly and anisotropically diffusing from interfaces between the first thin layer and the second thin film layer to the first thin film layer.

9. The method as set forth in claim 8, wherein:

the laminated structure is made of the first thin film layer including germanium (Ge) atoms and the second thin film layer including stibium (Sb) atoms.

10. The method as set forth in claim 9, wherein:

a thickness of each of the first and second thin film layers ranging from 0.3 to 2 nm.

11. The method as set forth in claim 10, wherein:

the germanium (Ge) atoms stored in the interfaces between the first thin film layer and the second thin film layer are reversibly and anisotropically diffused to the first thin film layer by electric energy.

12. The method as set forth in claim 10, wherein:

the phase-transformation is further caused by causing the germanium (Ge) atoms to be reversibly and anisotropically diffused from the first thin film layer to interfaces between the first thin film layer and the second thin film layer.

13. The method as set forth in claim 12, wherein:

the germanium (Ge) atoms are reversibly and anisotropically diffused from the first thin film layer to the interfaces between the first thin film layer and the second thin film layer by electric energy.

14. The method of claim 8, wherein the first thin film layer is GeTe and the second thin film layer is $Sb_2Te_3$.

* * * * *